United States Patent

Shih et al.

[11] Patent Number: 5,959,311
[45] Date of Patent: Sep. 28, 1999

[54] STRUCTURE OF AN ANTENNA EFFECT MONITOR

[75] Inventors: Hsueh-Hao Shih, Hsinchu; Mu-Chun Wang, Hsinchu Hsien; Juan-Yuan Wu, Hsinchu; Water Lur, Taipei, all of Taiwan

[73] Assignee: United Microelectronics Corp., Taiwan

[21] Appl. No.: 09/172,459

[22] Filed: Oct. 14, 1998

[30] Foreign Application Priority Data

Jul. 8, 1998 [TW] Taiwan .................................. 87111031

[51] Int. Cl.$^6$ ...................................................... H01L 23/58
[52] U.S. Cl. ............................ 257/48; 257/355; 257/356
[58] Field of Search .................................... 257/222, 355, 257/252, 48, 211, 365; 438/14, 17

[56] References Cited

U.S. PATENT DOCUMENTS 5,650,651  7/1997  Bui .......................................... 257/355
5,726,458  3/1998  Bui .......................................... 257/48

*Primary Examiner*—Donald L. Monin, Jr.
*Assistant Examiner*—Michael Dietrich
*Attorney, Agent, or Firm*—Thomas, Kayden, Horstemeyer & Risley, L.L.P.

[57] ABSTRACT

An antenna effect monitor includes a transistor formed on a semiconductor substrate. The transistor gate is coupled to a doped polysilicon interconnect layer which is also coupled to an antenna effect monitoring unit. Several metal bonding pads float in an orderly fashion above the doped polysilicon interconnect layer without coupling with each other. Several small metal layers are formed in an orderly fashion above the doped polysilicon interconnect layer but are electrically coupled together by several via plugs in between. The top small metal layer is coupled to the top bonding pad. The bottom small metal layer is electrically coupled to the doped polysilicon interconnect layer. Then a passivation layer covers the substrate but leaves a pad opening to expose the top bonding pad.

10 Claims, 1 Drawing Sheet

– continued –

STRUCTURE OF AN ANTENNA EFFECT MONITOR

CROSS-REFERENCE TO RELATED APPLICATION

This application claims the priority benefit of Taiwan application Ser. No. 87111031, filed Jul. 8, 1998, the full disclosure of which is incorporated herein by reference.

BACKGROUND OF THE INVENTION

1. Field of the Invention

This invention relates to a structure of an antenna effect monitor, and more particularly to a structure of an antenna effect monitor that can monitor the antenna effect when antenna ratio is smaller than 1000, in which the antenna effect induced by a bonding pad in the structure is also effectively avoided.

2. Description of Related Art

Antenna effect is a typical problem that occurs in semiconductor fabrication and causes instability of devices when plasma process is involved. During the plasma process in fabrication, the surface of a semiconductor substrate is bombarded by plasma ions and a large number of charged particles, such as electrons, are therefore created. These charged particles choose the route of lowest resistance to drift away through, for example, conductive layers and are accumulated by the device elements. These accumulated charges are also called static charges. As the accumulated charges exceed a certain level in the device elements, the device's electric properties may be shifted or the device may even be damaged. This phenomenon is called the antenna effect.

In general, the strength of antenna effect is proportional to an antenna ratio of area ($A_A$) or an antenna ratio of perimeter ($a_P$). A larger quantity of $A_A$ or $A_P$ induces a larger antenna effect. The $A_A$ and $A_P$ are defined in by the following:

$$A_A = M_A/G_A,$$

where $M_A$ is the area of an interconnect metal layer, and $G_A$ is the area of a gate;

$$A_P = M_P/G_P,$$

where $M_P$ is the perimeter of an interconnect metal layer, and $G_P$ is the perimeter of a gate.

According to the above formulas, if the area of the interconnect metal layer $M_A$ or the perimeter of the interconnect metal layer $M_P$ is reduced, then the antenna effect is reduced. The antenna effect is still reduced even if $G_A$ or $G_P$ is enlarged.

For semiconductor fabrication at a deep-submicron level or less, because the device integration is increased, it is difficult to detect the antenna effect between a multi-level interconnect metal layer and a polysilicon gate. The blind antenna effect causes a potential problem of device reliability. It becomes important to effectively monitor the antenna effect and avoid the antenna effect induced by the monitor structure itself.

In a conventional fabrication procedure, several different structures are used to monitor antenna effect and detect the damage of devices during a plasma process. The monitoring structure usually includes a long channel length structure, a dummy polysilicon layer with short channel length, or a small metal bonding pad with short channel length.

FIG. 1 is a cross-sectional view schematically illustrating a conventional structure for monitoring antenna effect. In FIG. 1, a transistor T1, such as a metal-oxide semiconductor (MOS) transistor, is formed on a semiconductor substrate 10. The transistor T1 includes a gate 11, which is electrically coupled to a monitoring unit of antenna effect 13 through a doped polysilicon layer 12 and a contact plug 14. A metal bonding pad 15 is also electrically coupled to the doped polysilicon layer 12 through a contact plug 16. A passivation layer 17 covers the substrate 10 but includes a pad window 18 exposing the metal bonding pad 15. Several internal structure, such as a multilevel interconnect metal layer or an inter-metal dielectric layer, related to the device design are not shown but conventionally exist.

The measurable antenna ratio for the metal bonding pad 15 to the gate 11 of the transistor T1 is about 1000–3000. If the antenna ratio is less than 1000, the antenna effect is not measurable but a blind exists to potentially affect the device reliability. Moreover, a protection diode (not shown) is usually coupled to the metal bonding pad 15 to avoid the antenna effect induced by the metal bonding pad 15 itself. Thus, the antenna damage induced by the metal bonding pad 15 on the transistor T1 may be reduced. However the protection diode cannot effectively prevent a plasma damage from occurring on the transistor T1.

SUMMARY OF THE INVENTION

It is therefore an objective of the present invention to provide an antenna effect monitor, which monitors the antenna effect on a transistor but contributes no antenna effect induced by the monitor itself on its a metal bonding pad. A number of metal bonding pads float without coupling with each other. Several small metal layers held by a dielectric layer are electrically coupled together through several via plugs in between. The top small metal layer is electrically coupled to the top metal bonding pad through a via plug. The bottom small metal layer is electrically coupled to the transistor through a contact plug. Thus, the antenna effect induced by the metal bonding pads on the transistor is avoided.

It is another an objective of the person invention to provide an antenna effect monitor, which monitors the antenna effect induced by a small metal layer or a doped polysilicon interconnect layer, and which is electrically coupled to a transistor. The antenna effect monitor used a polycide layer formed on the doped polysilicon interconnect layer in order to serve as a metal bonding pad. The polycide layer is separated into two parts by, for example, etching a little portion away. The two parts are electrically coupled together again through a small metal layer above the etched portion and two via plugs. Therefore, the antenna effect induced by the metal bonding pad on the transistor is avoided. The antenna effect of the small metal layer or the doped polysilicon inter-connect layer is measurable.

In accordance with the foregoing and other objectives of the present invention, a first antenna effect monitor is used to monitor the antenna effect induced by a metal bonding pad on a transistor formed on a semiconductor substrate. The first antenna effect monitor includes a doped polysilicon interconnect layer electrically coupled to a gate of the transistor. Then, a monitoring unit of antenna effect is electrically coupled to the doped polysilicon interconnect layer through a first contact plug. Several metal bonding pads float above the doped polysilicon interconnect layer without coupling between each other. Several small metal layers with area of less than about 5 $\mu$m×5 $\mu$m above the doped polysilicon interconnect layer are electrically coupled together by several first via plugs in between. This size produces an antenna ratio less than 10. The bottom small metal layer is electrically coupled to the doped polysilicon interconnect layer through a second contact plug. The top small layer is electrically coupled to the top metal bonding pad through a second via plug. A passivation layer covers the substrate but leaves a pad opening to expose the top metal bonding pad. The small metal layers can avoid the antenna effect induced by the metal bonding pad on the transistor.

In accordance with the foregoing and other objectives of the present invention, a second antenna effect monitor is used to monitor the antenna effect induced by a metal bonding pad on a transistor formed on a semiconductor substrate, or induced by the doped polysilicon interconnect layer. The second antenna effect monitor includes a doped polysilicon interconnect layer electrically coupled to a gate of the transistor. A polycide layer on the doped polysilicon interconnect layer serves as a metal bonding pad. Then, a monitoring unit of antenna effect is electrically coupled to the doped polysilicon inter-connect layer through a first contact plug on the polycide layer. The polycide layer is separated into two parts by, for example, etching. The two separated parts of the polycide layer are electrically coupled together through a small metal layer with a area of about less than 5 $\mu$m×5 $\mu$m and two second contact plugs. One second contact plug is electrically coupled to one part of the polycide layer, and the other second plug is electrically coupled to the other part of the polycide layer. A passivation layer is formed over the substrate but leaves a pad opening to expose the top metal bonding pad. Therefore, the antenna effect induced by the metal bonding pad on the transistor is avoided due to the small metal layer. The antenna effect of the small metal layer or the doped polysilicon interconnect layer is measurable.

BRIEF DESCRIPTION OF DRAWINGS

The invention can be more fully understood by reading the following detailed description of the preferred embodiments, with reference made to the accompanying drawings as follows.

DETAILED DESCRIPTION OF PREFERRED EMBODIMENTS

Example 1

Figure 1:
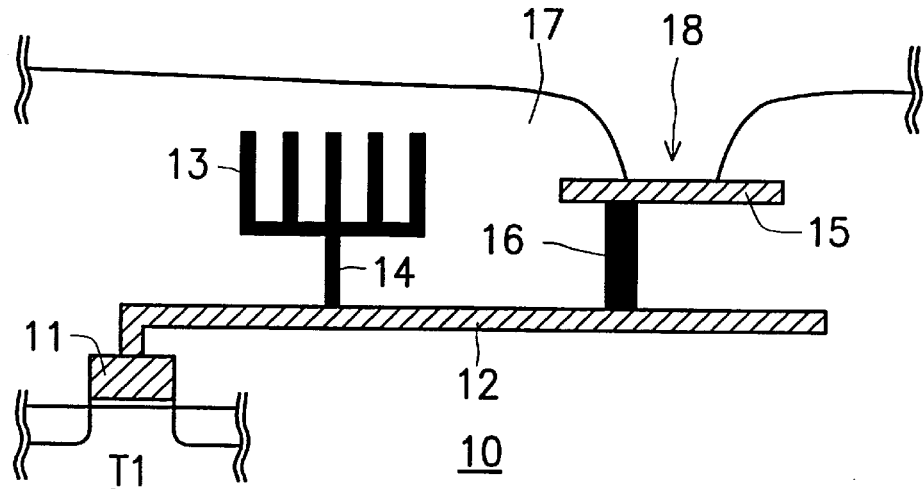
FIG. 1 is a cross-sectional view schematically illustrating a structure of a conventional antenna effect monitor.
Figure 2:
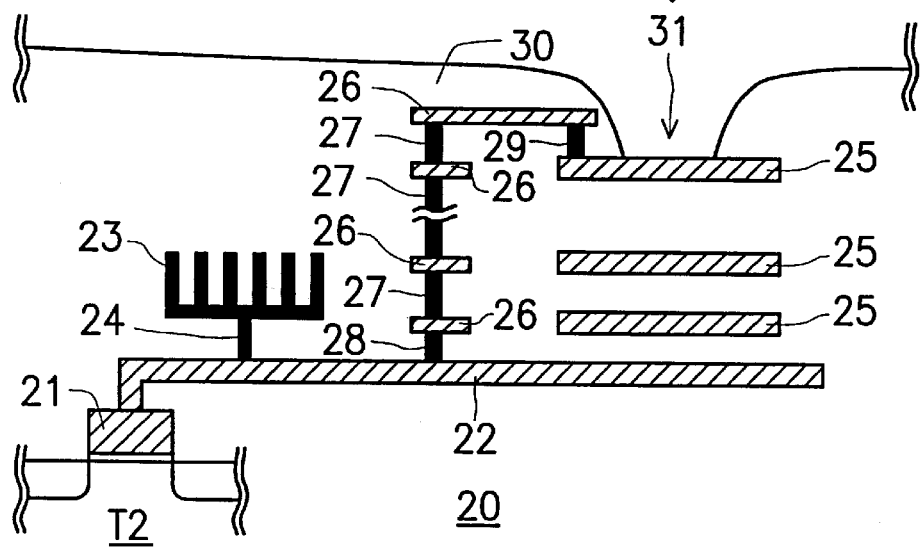
FIG. 2 is a cross-sectional view schematically illustrating a structure of an antenna effect monitor, according to a first preferred embodiment of the invention.

FIG. 2 is a cross-sectional view schematically illustrating a structure of an antenna effect monitor, according to a first preferred embodiment of the invention. In FIG. 2, a transistor T2, such as a metal-oxide semiconductor (MOS) transistor, is formed on a semiconductor substrate 20. The transistor T2 includes a gate 21, which is electrically coupled to a doped polysilicon interconnect layer 22. A monitoring unit of antenna effect 23 is electrically coupled to the doped polysilicon interconnect layer 22 through a contact plug 24. The monitoring unit of antenna effect 23 can measure the antenna effect occurring on the transistor T2.

A number of metal bonding pads 25 and a top bonding pad 25 are sequentially floating above the doped polysilicon interconnect layer 22 and are not coupled together. A number of small metal layers 26 with a area smaller than about 5 $\mu$m×5 $\mu$m are sequentially floating above the doped polysilicon interconnect layer 22 and are electrically coupled together by a via plug 27 in between them. The number of the small metal layers 26 is, for example, greater than the number of the metal bonding pads 25 by one. The top small metal layer 26 is electrically coupled to the top bonding pad 25 through a via plug 29. The bottom small metal layer 26 is electrically coupled to the doped polysilicon interconnect layer 22 through a contact plug 28. A passivation layer 30 covers the substrate but leaves a pad opening 31 to expose the top bonding pad 25. In FIG. 2, several internal structures, such dielectric layers, to hold the structure are not explicitly shown but should be familiar to one skilled in art.

The area of the small metal layers 26 is smaller than about 5 $\mu$m×5 $\mu$m. This size produces an antenna ratio less than 10. The pad opening 31 allows, for example, a probe test. The monitoring unit of antenna effect 23 is used to monitor the antenna effect induced by the metal bonding pads 25 on the transistor T2. All the metal bonding pads 25 are floating except the top metal bonding pad 25, which is indirectly coupled to the doped polysilicon interconnect layer 22. In this manner, the antenna effect induced by the metal bonding pads 25 on the transistor T2 is effectively avoided.

Example 2

Figure 3:
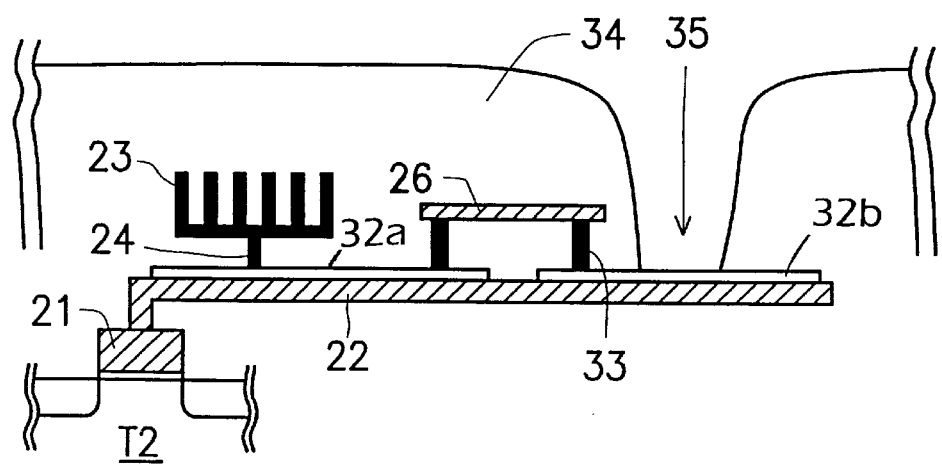
FIG. 3 is a cross-sectional view schematically illustrating a structure of an antenna effect monitor, according to a second preferred embodiment of the invention.

In FIG. 2, the antenna effect induced by the bottom small metal layer 26 or the doped polysilicon interconnect layer 22 can be measured by a second preferred embodiment similar to the first embodiment shown in FIG. 2. FIG. 3 is a cross-sectional view schematically illustrating a structure of an antenna effect monitor, according to a second preferred embodiment of the invention. The like reference numbers represents the like objects shown in FIG. 2 and therefore are not repeatedly described.

In FIG. 3, a polycide layer 32 is on the doped polysilicon interconnect layer 22 but is separated into two parts by, for example, etching a little portion away. One part of the polycide layer 32a, is electrically coupled to the monitoring unit of antenna effect 23 through the contact plug 24. The other part of the polycide layer 32b serves as the metal bonding pad. The small metal layer 26 is above the etched portion of the polycide layer 32 but is electrically coupled to the two parts of the polycide layer including polycide layer 32a and bonding pad 32b, through two via plugs 33 respectively on each part. So, the two separated parts of the polycide layer are electrically coupled together again. A passivation layer 34 covers the substrate but leaves a pad opening 35 to expose the metal bonding pad 32. The purpose of the polycide layer 32 is to avoid a direct measurement of the antenna effect on the doped polysilicon interconnect layer 22, which has a too high impedance. The antenna effect induced by the bonding pad 32b on the transistor T2 is also effectively avoided and the antenna effect induced by the small metal layer 26 or the doped polysilicon interconnect layer 22 is measured. The small metal layer 26 has an antenna ratio of about 10.

In conclusion, the first characteristic of the invention is that several floating metal bonding pads 25 and several small metal layers 26 are included. The top metal bonding pad 25 is electrically coupled to the top small metal layer 26 and the bottom small metal layer 26 is electrically coupled to the doped polysilicon interconnect layer 22 so that the antenna effect induced by the bonding pad on the transistor T2 is effectively avoided.

The second characteristics of the invention is that the polycide layer 32 is used to serve as the bonding pad 32b. The polycide layer 32 is on the doped polysilicon interconnect layer 22 and is separated into two parts, in which one part 32b is coupled to the monitoring unit of antenna effect 23 and the other part serves as the bonding pad 32b. The two parts are electrically coupled together through one small metal layer 26 and the contact plug 33. The antenna effect induced by the bonding pad 32b on the transistor T2 is effectively avoided and the antenna effect induced by the bottom small metal layer 26 or the doped polysilicon interconnect layer 22 is measured. The small metal layer 26 has an antenna ration of about 10.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A structure of an antenna effect monitor to monitor an antenna effect on a transistor, which is formed on a semiconductor, the structure comprising:
   a doped polysilicon interconnect layer electrically coupled to a gate of the transistor;
   a unit for monitoring antenna effect electrically coupled to the doped polysilicon interconnect layer through a first contact plug;
   a plurality of metal bonding pads sequentially floating above the doped polysilicon interconnect layer and not coupled to each other;
   a plurality of small metal layers sequentially floating above the doped polysilicon interconnect layer but electrically coupled by a plurality of first via plugs in between, wherein the top small metal layer is also electrically coupled to the top metal bonding pad through a second via plug, and the bottom metal layer is electrically coupled to the doped polysilicon interconnect layer through a second contact plug; and
   a passivation layer covers the substrate but leaves a pad opening to expose the top metal bonding pad.

2. The structure of claim 1, wherein the transistor comprises a metal-oxide semi-conductor (MOS) transistor.

3. The structure of claim 1, wherein the monitoring unit of antenna effect is used to measure the antenna effect induced by the metal bonding pad on the transistor.

4. The structure of claim 1, wherein the area of the small metal layers is about less than 5 $\mu$m×5 $\mu$m.

5. A structure of an antenna effect monitor to monitor an antenna effect on a transistor, which is formed on a semiconductor, the structure comprising:
   a doped polysilicon interconnect layer electrically coupled to a gate of the transistor;
   a polycide layer over the doped polysilicon interconnect layer, wherein the polycide layer is separated into a first part and a second part;
   a monitoring unit of antenna effect electrically coupled to the first part of the polycide layer through a first contact plug;
   a small metal layer over the polycide layer, which is electrically coupled to the first part of the polycide layer through a second contact plug and is electrically coupled to the second part of the polycide layer through a third contact plug; and
   a passivation layer covering the substrate but leaving a pad opening to expose the second part of the polycide layer, which serves as a metal bonding pad.

6. The structure of claim 5, wherein the transistor comprises a metal-oxide semi-conductor (MOS) transistor.

7. The structure of claim 5, wherein the monitoring unit of antenna effect is used to measure the antenna effect induced by the small metal layer on the transistor.

8. The structure of claim 5, wherein the antenna effect monitoring unit is used to measure the antenna effect induced by the doped polysilicon interconnect layer on the transistor.

9. The structure of claim 1, wherein the area of the small metal layers is less than about 5 $\mu$m×5 $\mu$m.

10. A structure of an antenna effect monitor to monitor an antenna effect on a transistor, which is formed on a semiconductor, the structure comprising:
    a doped polysilicon interconnect layer electrically coupled to a gate of the transistor;
    a unit for monitoring antenna effect electrically coupled to the doped polysilicon interconnect layer through a first contact plug;
    a plurality of metal bonding pads sequentially floating above the doped polysilicon interconnect layer and not coupled to each other;
    a plurality of small metal layers sequentially floating above the doped polysilicon interconnect layer but electrically coupled by a plurality of first via plugs in between, wherein the top small metal layer is also electrically coupled to the top metal bonding pad through a second via plug, and the bottom metal layer is electrically coupled to the doped polysilicon interconnect layer through a second contact plug, and the number of the small metal layers is more than the number of the metal bonding pads by one; and
    a passivation layer covers the substrate but leaves a pad opening to expose the top metal bonding pad.

* * * * *